United States Patent [19] [11] 3,776,771
Shepard [45] Dec. 4, 1973

[54] METHOD FOR ETCH RESIST COATING OF PLATED HOLES IN PRINTED CIRCUIT BOARDS

[76] Inventor: David Shepard, 2525 W. Washington Blvd., Los Angeles, Calif. 90018

[22] Filed: Feb. 9, 1972

[21] Appl. No.: 224,805

[52] U.S. Cl. .................... 117/212, 29/503, 117/98, 117/102 L
[51] Int. Cl. .................... B44d 1/06
[58] Field of Search .................... 118/122, 214, 123, 118/215, 124, 126; 117/102 L, 98, 102 M, 99, 212, 95, 10, 97, 11; 29/503; 228/36, 37, 56

[56] References Cited

UNITED STATES PATENTS

| | | | |
|---|---|---|---|
| 149,316 | 4/1874 | Karcheski | 117/102 L |
| 1,285,902 | 11/1918 | Buzzoni | 118/214 |
| 2,159,152 | 5/1939 | Hershberger | 117/102 M |

*Primary Examiner*—Morris Kaplan
*Attorney*—Allan M. Shapiro

[57] ABSTRACT

Etch resist coating is applied into the plated holes in a printed circuit board by dipping the board in a liquid etch resist solution of fairly low viscosity, squeezing the etch resist into the holes by pressing the board between opposed press rolls, followed by first squeegeeing the top and then the bottom of the board to wipe both surfaces. This results in a resist-coated hole.

6 Claims, 7 Drawing Figures

METHOD FOR ETCH RESIST COATING OF PLATED HOLES IN PRINTED CIRCUIT BOARDS

BACKGROUND OF THE INVENTION

1. Field of the Invention

This invention is directed to the process for coating etch resist material into plated holes in printed circuit boards so that subsequent processing by etching or plating protects the already plated holes from further processing until the resist is stripped.

2. Description of the Prior Art

Printed circuit boards are widely employed in modern electronics, both for convenience in assembly and enhancement of reliability. Complex wiring is created by mass production activities employing boards of electrically resistive material which support fairly thin metallic layers which serve as conductive paths and connection pads. Common printed circuit boards have an insulating base such as a filled phenolic board or an epoxy-fiberglass board on which is laminated a thin copper layer. This copper layer is etched away in selected areas so that the remaining copper provides circuit paths. The remaining copper areas can be enhanced by plating. These activities are well-known in the art.

The complexity of printed circuit board design is restricted when a board having copper on only one side thereof is employed. Component layout must be carefully accomplished, because cross-overs in the printed circuit areas are not feasible without considerable extra steps. However, in order to overcome this limitation of single-sided boards, double-sided printed circuit boards are employed. While the components normally are mounted on only one side of the double-sided printed circuit board, in order to permit dip soldering of the components in a single mass production step, the employment of the double-sided board permits very much more complex circuitry, including extensive crossovers.

With the employment of such double-sided printed circuit boards, selective connection between the circuits on the opposite sides of the board must be made, in order to be able to employ the benefits of this type of board construction. It is known in the prior art that interconnection between the opposite sides of the board can be accomplished by drilling a hole through the board, and then through-plating the hole.

Through-hole plating is a well developed art and such plating is presently accomplished on a routine basis. Problems arise, however, after such holes are plated and it is desired that etching be accomplished for determining the selected electrical paths in the copper lamina on the surface of the printed circuit boards, as previously described. Coating an etch resist material into the plated-through holes with reliability has been difficult. It is the purpose of this invention to provide both a process and apparatus for coating an etch resist material into plated holes in a printed circuit board, with reliability and in such a manner that reliable coating can be quickly and economically completed.

SUMMARY OF THE INVENTION

In order to aid in the understanding of this invention, it can be stated in essentially summary form that it is directed to the process and apparatus for etch resist coating of plated holes in printed circuit boards. The process comprises wetting the board with a fairly low viscosity etch resist solution, rolling the board between opposed rollers to squeeze the solution through the plated through holes, followed by squeegeeing first the top and then the bottom of the board to wipe a substantial amount of the etch resist material from the surface of the board. The apparatus comprises means to apply the etch resist, opposed rollers for squeezing the printed circuit board therebetween, and squeegee blades positioned to successively squeegee the top and the bottom of the board.

Accordingly, it is an object of this invention to provide a process for etch resist coating of plated holes in printed circuit boards. It is another object to provide a process which reliably, quickly and economically coats the plated holes in a printed circuit board. It is another object to provide a process for resist coating through-plated holes in a printed circuit board, without plugging up the holes with resist material so that the resist material can be subsequently readily stripped.

It is a further object to provide the low viscosity resist coating on the circuit board, and to squeeze the coating into through-plated holes therein by means of pinch rolls. It is another object to provide squeegee blades which are adjustably positionable along the direction of motion of the printed circuit board, and angularly adjustable with respect to the surface of the printed circuit board so that, as the printed circuit board is passed therebetween, both sides are squeegeed. It is another object to provide positioning of the squeegee blades so that the top of the board is first squeegeed, followed by squeegeeing of the bottom of the board.

It is a further object to provide an apparatus for accomplishing the above-described method, including pinch rollers and squeegee blades. It is a further object to provide an apparatus which has motor-driven rolls between which the resist coated printed circuit board can be engaged, so that feeding therethrough is motor-propelled. It is another object to provide an apparatus which is adjustable so that the amount of pinch is adjustable. It is a further object to provide an apparatus which includes squeegee blades of such position and such adjustability that squeegeeing of both surfaces of the printed circuit board is accomplished. It is yet another object to provide an apparatus wherein the squeegee blades are positioned immediately after the pinch rolls so that the board is propelled out of the pinch rolls between the squeegee blades.

The features of the present invention which are believed to be novel are set forth with particularity in the appended claims. The present invention, both as to its organization and manner of operation, together with further objects and advantages thereof, may be understood best by reference to the following description, taken in conjunction with the accompanying drawings.

2, showing etch resist material in the hole, as applied by the process and apparatus.

Figures 1, 2, 3:
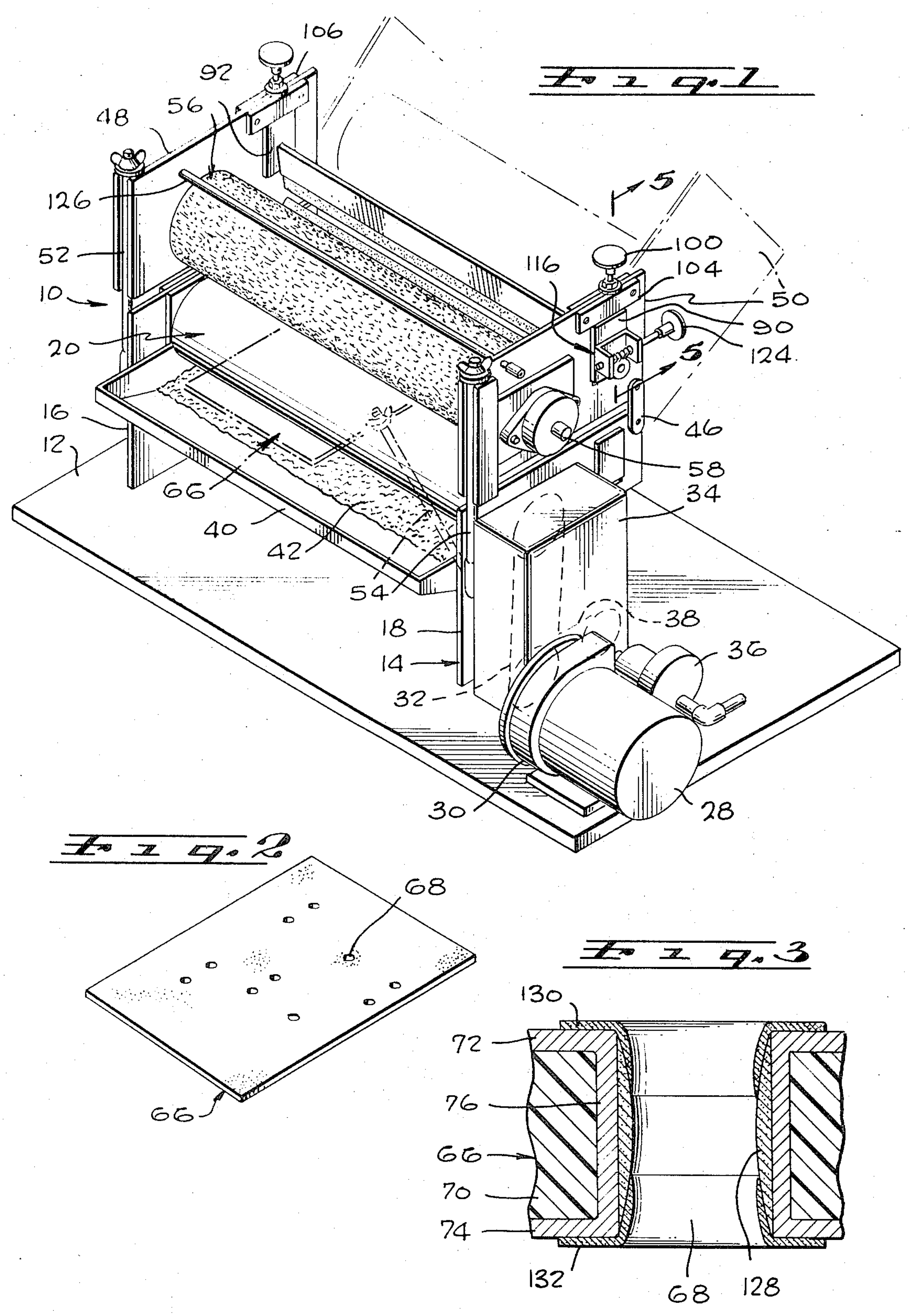
FIG. 1 is an isometric view of the apparatus for etch resist coating of plated holes in printed circuit boards, in accordance with this invention, and showing in dashed lines the position of some of the parts of the apparatus as opened for cleaning.
FIG. 2 is an isometric view of a printed circuit board having plated holes therethrough, and which is treated by the process and apparatus of this invention.
FIG. 3 is an enlarged section through the plated hole in a printed circuit board of the nature shown in FIG.
Figures 4, 5, 6, 7:
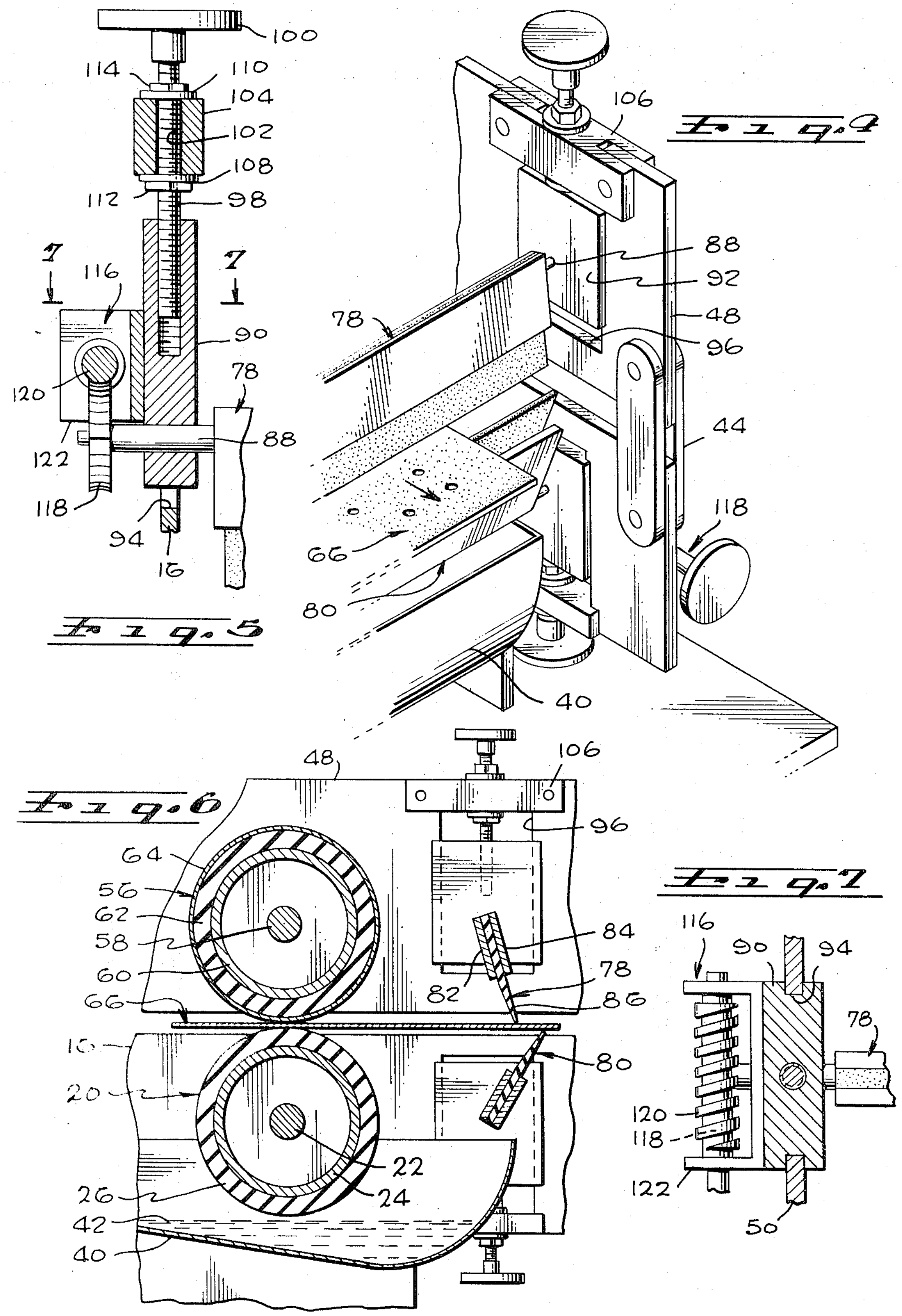

FIG. 4 is an enlarged isometric view of the apparatus of FIG. 1, taken from the rear, with parts broken away.

FIG. 5 is an enlarged section taken generally along the line 5—5 of FIG. 1, with some parts shown in elevation, some in section, and some broken away.

FIG. 6 is an enlarged upright central section, with parts broken away, of the apparatus shown in FIG. 1.

FIG. 7 is a section taken generally along line 7—7 of FIG. 5.

DESCRIPTION OF THE PREFERRED EMBODIMENT

Referring to the drawings, FIG. 1 illustrates the entrance side of the apparatus 10, along with the top and right side thereof. The coating apparatus 10 is mounted upon base 12, which can be any table top or support of convenient nature. The base 12 is appropriately part of a continuous processing machine, or can be merely a support table for supporting the apparatus 10 at a convenient height for manual operation. Main frame 14 comprises left and right side frames 16 and 18. The side frames are secured to the base and form the fixed main frame structure of the apparatus 10.

As best shown in FIG. 6 in conjunction with FIG. 1, drive roller 20 is the lower roller of a pair of pinch rollers. Drive roller 20 has a central shaft 22. Shaft 22 is rotatably mounted on suitable bearings secured to the side frames 16 and 18. Thus, drive roller 20 is rotatably mounted in the apparatus 10. Drive roller 20 comprises tube 24 which is secured to the central shaft 22 and carries a rubber sleeve 26. Rubber sleeve 26 is the surface of drive roller 20 which directly engages upon the printed circuit board. Drive roller 20 is driven by motor 28. Motor 28 has gear reduction 30 directly coupled thereto. The output of the gear reduction is connected to drive shaft 22 of roller 20 by any convenient drive method, such as belt or chain drive. Belt 32 is illustrated as being enclosed within guard 34. Any convenient drive interconnection can be provided. Motor 28 is also connected to drive liquid pump 36 by any convenient means such as, for example, belt drive 38.

Bath tray 40 is mounted between side frames 16 and 18 below drive roller 20. Bath tray 40 is for holding a supply of the liquid solution of resist coating 42. Bath tray 40 receives the resist coating as it drips downward from drive roller 20. The suction of liquid pump 36 is connected to tray 40 to pump the resist coating from the tray for various purposes, as is hereinafter described.

Hinge links 44 and 46 are mounted upon the upper rear corner of the side frames 16 and 18. Upper side frames 48 and 50 are respectively fitted on these hinge links. Thus, the upper side frames are swingable from the position where they are located over the lower side frames 16 and 18, as shown in solid lines in FIG. 1, to a position where they are swung up above the rear of the apparatus 10 to open the apparatus. In this open position, shown in dotted lines in FIG. 1, the interior of the apparatus is accessible for cleaning. Clamp bolts 52 and 54 engage on both the upper and lower side frames, so that tightening of the thumb nuts shown on the top of the clamp bolts clamps the side frames toward each other.

Upper side frames 48 and 50 carry upper roller 56 therebetween so that clamping the upper side frames toward the lower side frames clamps the upper roller against the drive roller 20. Upper roller 56 is similar to drive roller 20 in that it has a central shaft 58, tube 60, and a rubber sleeve 62. Mounted exteriorly of rubber sleeve 62 is cloth sleeve 64. Cloth sleeve 64 is preferably a fabric having short pile and having a nap approximately as long as the thickness of the printed circuit board, so that the pile can extend at least partway through the holes to be coated in a printed circuit board. The central shaft 58 of upper roller 56 is mounted in journals secured to the upper side frames so that, as the upper side frames are clamped down on the lower side frames by means of the clamp bolts 52 and 54, as previously described, the pinch pressure between the upper and lower rollers is controlled.

In addition to the hinge links 44 and 46 permitting pinch pressure control between the rollers, they also permit the upper side frame to be swung up and back to separate the rollers for cleaning. In this mode, the thumb nuts on clamp bolts 52 and 54 are loosened, and the clamp bolts are swung forward. In this condition, the upper side frames are free to swing upward to permit access to the center of the coating apparatus for the maintenance thereof.

As is described in more detail hereinafter, the printed circuit board is coated with a liquid solution of resist coating and is then passed between the drive roller 20 and upper roller 56. At the pinch therebetween, the resist coating is forced through the holes in the printed circuit boards. After the board passes the pinch of the rollers, it is necessary to squeegee the upper and lower surfaces of the board to remove the excess resist coating solution.

The printed circuit board 66 is illustrated in FIGS. 2, 3, 4, and 6. The printed circuit board 66 has the hole 68 therethrough, as well as many other similar holes. Printed circuit board 66 comprises the board 70, of filled phenolic, fiberglass-epoxy or similar construction. Laminated onto the upper surface of the board is conductor layer 72, usually copper, while a similar layer 74 is laminated on the lower surface of the board. Similarly, the hole 68 is plated through with the copper layer 76, which is in the form of a cylinder extending through the hole and metallurgically joined to the upper and lower copper layers 72 and 74. It is this copper layer 76 in the hole in the board, and which defines hole 68 interiorly thereof, which is required to be protected by the process and apparatus of this invention.

As described above, and as described in more detail below, the board 66 has a layer of resist coating in solution applied thereto and is then passed between the pinch of the rolls, as shown in FIG. 6. As the board leaves the pinch between the upper and lower rollers, squeegees 78 and 80 successively engage upon and wipe the upper and lower surfaces of printed circuit board 66.

Each of the upper and lower squeegees is formed of a resilient blade of elastomeric material, such as rubber, or similar synthetic polymer composition material. The elastomeric squeegee blades are clamped between metallic backup or holder clamp bars, such as the bars 82 and 84 clamped around the squeegee blade 86 of the upper squeegee 78. The lower squeegee 80 is of similar construction. Each of the squeegees is mounted in the side frame for motion toward and away from the plane passing through the pinch of the rolls, which is the plane of the printed circuit board 66 as it passes through the rolls, and is mounted for rotation on an axis substantially parallel to the roller axes. Thus, the angle of the squeegee with respect to the plane and the amount of pressure exerted by the squeegee blade onto a printed circuit board passing along the plane can be adjusted. Both of the squeegees are adjusted in similar manner as by mechanism hereinafter described.

The upper squeegee 78 is mounted on each end on a pivot shaft. The pivot shaft 88 extends from the end of the squeegee on each end thereof. It passes into bearing block 90 on the right end and into bearing block 92 on the left end. These bearing blocks have upright grooves along the edges. Upright slot 94 is cut in the left side frame and slot 96 is cut in the right side frame. The bearing blocks have guide grooves in the upright edges thereof, which guide grooves engage around the side frames at the upright slots so that the bearing blocks are guided for vertical movement in the side frames.

Vertical adjustment of the bearing blocks in the side frames is accomplished by adjustment screws. The adjustment screw 98 is illustrated in FIG. 5 with respect to bearing block 90 which is internally threaded. Adjustment screw 98 is provided with threads along its length and a knob 100 secured to its end. The upward end of adjustment screw 98 passes freely through bore 102 in crossbar 104 so as to be in freely rotatable relationship thereto. Crossbar 104 is similar to crossbar 106, and these crossbars are respectively secured to the top of the upper side frames 50 and 48. A pair of thrust bearings 108 and 110 are disposed around screw 98 to bear against opposite sides of crossbar 104. A pair of nuts 112 and 114 are threaded onto screw 98 and tightly secured against respective thrust bearings 108 and 110, thereby assuring that screw 98 is immobilized against vertical movement relative to crossbar 104 while still freely rotatable, i.e., is vertically constrained with respect to its crossbar. Thus, when the knob 100 rotates the screw 98, the screw 98 drives the bearing block 90 up or down in its slot for vertical adjustment of the squeegee. There are four such vertical adjustments, with one positioned on each end of each of the two squeegees. Thus, vertical adjustment of each of the squeegees is accomplished by the respective knob rotation. This adjustment adjusts the squeegees in a direction normal to the plane passing through the pinch rolls.

In addition to the adjustment of the squeegees toward and away from the reference plane, the squeegees can be rotated on an axis substantially parallel to the plane and substantially parallel to the axes of the rollers. As previously described, the squeegees are pivotally mounted in the bearing blocks. Rotational control of the squeegees on these rotational axes is accomplished by means of a rotational drive. Rotational drive 116 is illustrated generally in FIG. 1 with respect to the upper squeegee 78. An identical rotational drive is provided for the lower squeegee 80 on the opposite end of the apparatus 10 and is partially indicated at 118 in FIG. 4. However, it is identical to the rotational drive 116. As seen in FIGS. 5 and 7, rotational drive 116 comprises worm wheel 118 fixed to pivot shaft 88 of the upper squeegee 78, outboard of the right bearing block 90. Worm 120 is rotationally supported in bracket 122, which is mounted upon the outside of bearing block 90. Worm 120 is in engagement with worm wheel 118. Adjustment knob 124, see FIG. 1, is connected to drive worm 120 which, in turn, causes rotation of upper squeegee 78. By this means, the angle of the squeegee blade with respect to the reference plane can be adjusted. Both upper and lower squeegees are thus adjusted. It is to be noted that the upper squeegee 78 engages and wipes the top of printed circuit board 66, before the lower squeegee 80 wipes the bottom thereof. This is accomplished by lateral positioning of the squeegees along the reference plane, and this positioning can be adjustable, as desired. Such adjustment can be provided by any convenient means, and is provided by the illustrated mechanism by the combination of vertical and rotational adjustability. The process by which the apparatus 10 is employed starts with the printed circuit board 66. The circuit board 66 is previously processed before it is brought to the coating apparatus 10. As it is brought to be coated, it has the upper and lower copper layers 72 and 74 and the wall coated with the copper layer 76. It is this layer of metal 76 that is to be protected by the coating apparatus method of this invention. There are several ways of coating the printed circuit board 66 with etch resist before it goes into the pinch of the rolls. In a non-continuous production line, the board 66 can be dipped into the resist coating 42 within bath tray 40. By this means, all surfaces of the printed circuit board 66 are coated. Another way comprises the employment of sprays for spraying the top and bottom of the board. Spray manifold 126 is positioned across the top of the apparatus between the upper side frames to spray the etch resist upon roller 56 for application to roller 20 as well as the printed circuit board. The spray manifold may be supplied by liquid pump 36. As another way of putting the liquid etch resist solution upon the board, especially in an automatic processing line, the boards can be carried by a conveyor device through the feed tank bath of the etch resist. In any event, the printed circuit board 66 is fairly coated on all surfaces with etch resist.

The etch resist for proper coating should be a thin, flowing solution. A viscosity of from 10 to 20 Sayboldt seconds is an appropriate viscosity. This viscosity is much lower than has been previously used successfully, but this lower viscosity permits quicker and more uniform wetting of the board with the solution and permits the holes through the board to be coated without plugging. Any convenient commercial etch resist material can be employed, so long as it is appropriately thinned to meet the viscosity requirements, which are fairly low as compared to present practice.

After coating, the printed circuit board is inserted into the pinch between the rollers 20 and 56. The upper roller 56, with its cloth sleeve 64, causes the etch resist coating material to flow into the holes in the board, including the hole 68, to thoroughly coat the metal 76. The drive motor rotates the rolls, so the board is propelled. The rollers 56 and 20 define an operating plane through the pinch thereof, along which the printed circuit board 66 travels. This plane passes between the squeegees, and the board 66 following this plane engages between and passes between the squeegees 78 and 80.

The upper squeegee 78 first engages upon the top of the board 66 and wipes the top of the board. This wiping causes some of the etch resist coating to be forced downward through the holes and causes the balance to be wiped off of the board so that the top is quite clean.

The lower squeegee 80 is positioned so that it engages the bottom of the board farther along the path of motion of the board. Thus, after the top squeegee forces some of the etch resist material down through the holes, the bottom of the board is wiped so that the excess etch resist material runs back into the bath tray 40.

Adjustment of the vertical position of both squeegees with respect to the plane of action, and the angular adjustment for adjusting the squeegee blade angle with respect to the reference plane are both necessary for a clean squeegee operation which is quick and chatter free. Both of the top and bottom squeegees must be adjustable. When the printed circuit boards 66 are originally made, there are slight ridges around at least some of the holes. The apparatus 10 requires squeegee adjustment to leave a minimum amount of etch resist material behind these ridges. It is seen that the low viscosity of the etch resist material is necessary to permit the etch resist to pass through the holes without plugging the holes. It is essential that the holes be coated, but that they not be plugged so that, in later stripping operation, the stripping can be easily accomplished.

The squeegee blades are required to wipe both the top and bottom of the board as clean as possible, and to accomplish this in a quick and chatter free manner. The adjustment of the squeegees depends on the type of board material. The glass-epoxy board requires a different squeegee pressure and angle than a filled phenolic board. Furthermore, the character of the board surface affects the squeegee operation. Thus, it is a problem of squeegee angle with respect to the reference plane, the squeegee pressure, and the spacing of the squeegees in the direction of movement of the board. By empirical work, it has been determined that the wiping edge of the lower squeegee should be one hole diameter in the direction of movement from the wiping edge of the first squeegee for best results. The apparatus is built for or adjustable to obtain this spacing. When holes of a plurality of sizes are found in a particular board, the hole with the largest diameter should be employed for making this squeegee position adjustment.

After coating the holes with the etch resist solution, the etch resist coating is cured by baking it. The amount of baking is a function of the particular type of etch resist coating employed, but 5 to 10 minutes at 250 degrees in a drying oven is usually an appropriate baking and curing cycle. Upon curing, the etch resist coating has a shape and appearance generally illustrated in FIG. 3 and indicated at 128.

As the next step in the process, the printed circuit board is cleaned on both sides. This is best accomplished by fine wet sanding, because very little etch resist coating is present on the surfaces. Other cleaning methods are possible, such as careful application of the solvent for the threaded coating. In any event, now the holes are protected with etch resist, and the upper and lower surfaces of the boards are bare to the metal.

As the next step in the process, an appropriate etch resist is applied to the surfaces of the board. This can either be the conventional photoresist technique, exposed and developed, but is preferably the silk screen masking of etch resist material onto the printed circuit board. Illustrated in FIG. 3, etch resist coatings 130 and 132 are applied to the upper and lower surfaces of the board. In this case, they are silk-screened in place so that the etch resist coating is applied where conductive paths are later desired. This permits employment of a positive image-type of processing in preparation for the etching step. It should be seen in FIG. 3 that the etch resist coatings applied by silk screening extend into the hole, because the coating 128 can be seen from both surfaces so that the silk-screened etch resist can lay thereon. This fills out and protects the corner of the metal at the juncture between the wall and the flat surface of the board.

After the etch resist is completed, the printed circuit board is dipped into an etch solution so that the unprotected metal is etched away. After completion of etching, the etch resist is stripped away so that the printed circuit board 66 is ready for electronic assembly. By this means, reliable etch resist coatings in through-holes is accomplished.

While a particular embodiment of the present invention has been shown and described, it will be obvious to those skilled in the art that changes and modifications may be made without departing from this invention in its broader aspects and, therefore, the aim in the appended claims is to cover all such changes and modifications as fall within the true spirit and scope of this invention.

What is claimed is:

1. The process of applying a low viscosity etch resist coating solution to the interior of holes in through plated printed circuit boards without plugging said holes and comprising the steps of:
feeding a horizontally disposed said printed circuit board along a horizontal path;
applying said etch resist coating to the bottom surface of the board;
engaging the printed circuit board between vertically aligned pinch rolls disposed normal to said path and rolling the board between said pinch rolls for squeezing the coating into the holes in the printed circuit board;
squeegeeing the top of the printed circuit board to force at least part of the liquid coating solution on the top down through the holes in the printed circuit board; and
squeegeeing the bottom of the printed circuit board subsequently to the squeegeeing of the top thereof.

2. The process of claim 1 wherein
the coating step is accomplished by applying a liquid coating solution having a viscosity between 10 and 20 Sayboldt seconds to the printed circuit board so that the liquid coating solution readily flows through holes in the printed circuit board.

3. The method of claim 2 wherein
the step of applying the liquid coating solution comprises dipping the printed circuit board into a vessel containing the liquid coating solution.

4. The method of claim 1 wherein
said squeegeeing steps are succeeded by the step of drying the coating solution on the printed circuit board.

5. The method of claim 4 wherein
said drying step is a baking step.

6. The method of claim 4 wherein
the step of applying the coating solution comprises dipping the printed circuit board into a vessel containing the coating solution.

* * * * *